(12) United States Patent
Chen

(10) Patent No.: US 6,743,532 B1
(45) Date of Patent: Jun. 1, 2004

(54) COATED ARTICLE

(75) Inventor: Guocun Chen, Broomfield, CO (US)

(73) Assignee: Vapor Technologies, Inc., Boulder, CO (US)

( * ) Notice: Subject to any disclaimer, the term of this patent is extended or adjusted under 35 U.S.C. 154(b) by 0 days.

(21) Appl. No.: 10/306,586

(22) Filed: Nov. 27, 2002

(51) Int. Cl.$^7$ .............................................. B32B 15/04
(52) U.S. Cl. ...................... 428/699; 428/623; 428/627; 428/628; 428/629; 428/632; 428/633; 428/667; 428/680; 428/687; 428/698; 428/701; 428/702; 428/704
(58) Field of Search ................................ 428/621, 622, 428/623, 627, 628, 629, 632, 633, 666, 667, 680, 687, 688, 689, 697, 698, 699, 701, 702, 704

(56) References Cited

U.S. PATENT DOCUMENTS 5,879,532 A * 3/1999 Foster et al. ................ 205/192
6,196,936 B1 * 3/2001 Meckel ........................ 473/349

\* cited by examiner

*Primary Examiner*—Andew T. Piziali
(74) *Attorney, Agent, or Firm*—Lloyd D. Doigan

(57) ABSTRACT

An article is coated with a multi-layer coating having a bronze color. The coating comprises a nickel basecoat layer, and a color and protective stack layer comprised of layers of carbon-rich refractory metal or refractory metal alloy carbonitride alternating with layers of nitrogen-rich refractory metal or refractory metal alloy carbonitride.

21 Claims, 1 Drawing Sheet

COATED ARTICLE

FIELD OF THE INVENTION

This invention relates to articles, particularly brass articles, having a multi-layered decorative and protective coating having the appearance or color of bronze, particularly antique bronze, thereon.

BACKGROUND OF THE INVENTION

It is currently the practice with various brass articles such as faucets, faucet escutcheons, door knobs, door handles, door escutcheons and the like to first buff and polish the surface of the article to a high gloss and to then apply a protective organic coating, such as one comprised of acrylics, urethanes, epoxies and the like, onto this polished surface. This system has the drawback that the buffing and polishing operation, particularly if the article is of a complex shape, is labor intensive. Also, the known organic coatings are not always as durable as desired, and are susceptible to attack by acids. It would, therefore, be quite advantageous if brass articles, or indeed other articles, either plastic, ceramic, or metallic, could be provided with coating which provided the article with a decorative appearance as well as providing wear resistance, abrasion resistance and corrosion resistance. It is known in the art that a multi-layered coating can be applied to an article which provides a decorative appearance as well as providing wear resistance, abrasion resistance and corrosion resistance. This multi-layer coating includes a decorative and protective color layer of a refractory metal nitride such as a zirconium nitride or a titanium nitride. This color layer, when it is zirconium nitride, provides a brass color, and when it is titanium nitride provides a gold color.

U.S. Pat. Nos. 5,922,478; 6,033,790 and 5,654,108, inter alia, describe a coating which provides an article with a decorative color, such as polished brass, provides wear resistance, abrasion resistance and corrosion resistance. It would be very advantageous if a coating could be provided which provided substantially the same properties as the coatings containing zirconium nitride or titanium nitride but instead of being brass colored or gold colored was bronze, particularly antique bronze, colored. The present invention provides such a coating.

SUMMARY OF THE INVENTION

The present invention is directed to an article such as a plastic, ceramic, cermet or metallic article having a decorative and protective multi-layer coating deposited on at least a portion of its surface. More particularly, it is directed to an article or substrate, particularly a metallic article such as stainless steel, aluminum, brass or zinc, having deposited on its surface multiple superposed layers of certain specific types of materials. The coating is decorative and also provides corrosion resistance, wear resistance and abrasion resistance. The coating provides the appearance or color of bronze, particularly antique bronze, i.e. has a two-tone color: dark gray and dark yellow. Thus, an article surface having the coating thereon simulates a bronze, particularly an antique bronze surface.

The article first has deposited on its surface one or more electroplated layers. On top of the electroplated layers is then deposited, by vapor deposition such as physical vapor deposition, one or more vapor deposited layers. A first layer deposited directly on the surface of the substrate is comprised of nickel. The first layer may be monolithic or it may consist of two different nickel layers such as, for example, a semi-bright nickel layer deposited directly on the surface of the substrate and a bright nickel layer superimposed over the semi-bright nickel layer. Disposed over the electroplated layers is a strike layer comprised of a refractory metal or metal alloy such as zirconium, titanium, hafnium, tantalum or zirconium-titanium alloy, preferably zirconium, titanium or zirconium-titanium alloy. In one embodiment disposed intermediate the nickel layer and the strike layer is a strengthening layer comprised of chromium. Over the strike layer is a protective and decorative color layer comprised of a stack layer comprised of layers of carbon-rich refractory metal carbonitride alternating with layers of nitrogen-rich refractory metal carbonitride, such as zirconium carbonitride, titanium carbonitride, tantalum carbonitride and hafnium carbonitride, and the carbonitrides of refractory metal alloys, such as a titanium-zirconium alloy. These alternating layers of the stack layer may contain a small percentage of oxygen in order to increase the dark appearance of the coating. The small amount of oxygen ranges from about 2 to about 15 atomic percent. For zirconium, in the carbon-rich zirconium carbonitride layer, the carbon content generally is between about 25 to about 50 atomic percent, nitrogen content between about 5 to about 35 atomic percent, and this layer has a dark gray color. In the nitrogen-rich zirconium carbonitride layer, the nitrogen content is between about 25 to about 50 atomic percent, carbon content between about 5 to about 35 atomic percent; and this layer has a dark yellow color with a slight reddish tint. Neither of these two layers is thick enough by itself to make the coating have its own color. However, when two or more of these layers are present, the overall color of the stack layers mimics a dark gray and dark yellow two-tone antique bronze appearance. On the top of this color layer, a very thin layer of refractory metal oxide or refractory metal alloy oxide is deposited in order to improve the corrosion and chemical resistance of the coating.

DESCRIPTION OF THE PREFERRED EMBODIMENT

The article or substrate 12 can be comprised of any material onto which a plated layer can be applied, such as plastic, e.g., ABS, polyolefin, polyvinylchloride, and phenolformaldehyde, ceramic, cermet, metal or, metal alloy. In one embodiment it is comprised of a metal or metallic alloy such as copper, steel, brass, zinc, aluminum, nickel alloys and the like.

Figure 1:
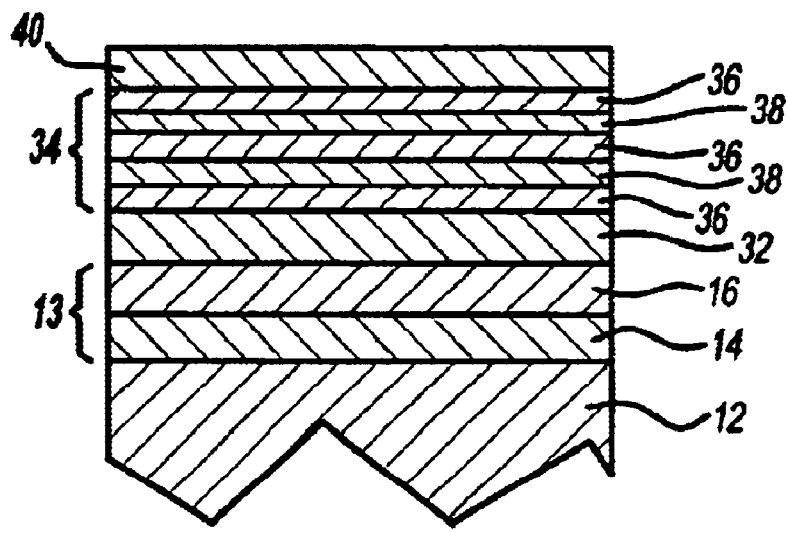
FIG. 1 is a cross sectional view, not to scale, of a portion of the substrate having a multi-layer coating comprising a duplex nickel base coat, a refractory metal layer, a stack layer comprised of alternating layers of carbon-rich refractory carbonitride layers and nitrogen-rich refractory carbonitride layers, and a thin refractory metal oxide layer.
Figure 2:
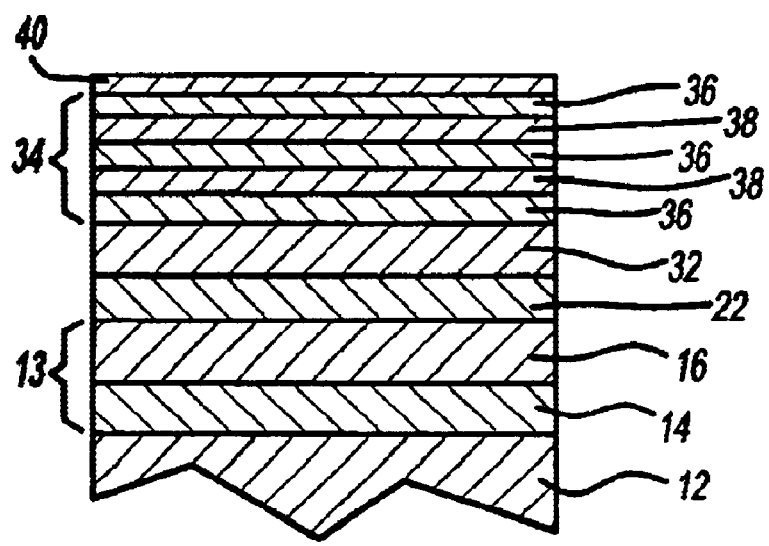
FIG. 2 is a view similar to FIG. 1 except that a strengthening chromium layer is present intermediate the top nickel layer and the refractory metal strike layer.

In the instant invention, as illustrated in FIGS. 1 and 2, a first layer or series of layers is applied onto the surface of the article by plating such as electroplating. A second series of layers is applied onto the surface of the electroplated layer or layers by vapor deposition. The electroplated layers serve, inter alia, as a base coat which levels the surface of the article and as a corrosion barrier to improve corrosion resistance. In one embodiment of the instant invention a nickel layer 13 may be deposited on the surface of the article. The nickel layer may be any of the conventional nickels that are deposited by plating, e.g., bright nickel, semi-bright nickel, satin nickel, etc. The nickel layer 13 may be deposited on at least a portion of the surface of the substrate 12 by conventional and well-known electroplating processes. These processes include using a conventional electroplating bath such as, for example, a Watts bath as the plating solution. Typically such baths contain nickel sulfate, nickel chloride, and boric acid dissolved in water. All chloride, sulfamate and fluoroborate plating solutions can also be used. These baths can optionally include a number of well known and conventionally used compounds such as leveling agents, brighteners, and the like. To produce specularly bright nickel layer at least one brightener from class I and at least one brightener from class II is added to the plating solution. Class I brighteners are organic compounds which contain sulfur. Class II brighteners are organic compounds which do not contain sulfur. Class II brighteners can also cause leveling and, when added to the plating bath without the sulfur-containing class I brighteners, result in semi-bright nickel deposits. These class I brighteners include alkyl naphthalene and benzene sulfonic acids, the benzene and, naphthalene di- and trisulfonic acids, benzene and naphthalene sulfonamides, and sulfonamides such as saccharin, vinyl and allyl sulfonamides and sulfonic acids. The class II brighteners generally are unsaturated organic materials such as, for example, acetylenic or ethylenic alcohols, ethoxylated and propoxylated acetylenic alcohols, coumarins, and aldehydes. These class I and class II brighteners are well known to those skilled in the art and are readily commercially available. They are described, inter alia, in U.S. Pat. No. 4,421,611 incorporated herein by reference.

The nickel layer can be comprised of a monolithic layer such as semi-bright nickel, satin nickel or bright nickel, or it can be a duplex layer containing two different nickel layers, for example, a layer comprised of semi-bright nickel and a layer comprised of bright nickel. The thickness of the nickel layer is generally a thickness effective to level the surface of the article and to provide improved corrosion resistance. This thickness is generally in the range of from about 2.5 $\mu$m, preferably about 4 $\mu$m, to about 90 $\mu$m.

As is well known in the art before the nickel layer is deposited on the substrate the substrate is subjected to acid activation by being placed in a conventional and well known acid bath.

In one embodiment as illustrated in FIGS. 1 and 2, the nickel layer 13 is actually comprised of two different nickel layers 14 and 16. Layer 14 is comprised of semi-bright nickel while layer 16 is comprised of bright nickel. This duplex nickel deposit provides improved corrosion protection to the underlying substrate. The semi-bright, sulfur-free layer 14 is deposited by conventional electroplating processes directly on the surface of substrate 12. The substrate 12 containing the semi-bright nickel layer 14 is then placed in a bright nickel plating bath and the bright nickel layer 16 is deposited on the semi-bright nickel layer 14.

The thickness of the semi-bright nickel layer and the bright nickel layer is a thickness at least effective to provide improved corrosion protection and/or leveling of the article surface. Generally, the thickness of the semi-bright nickel layer is at least about 1.25 $\mu$m (microns), preferably at least about 2.5 $\mu$m, and more preferably at least about 3.5 $\mu$m. The upper thickness limit is generally not critical and is governed by secondary considerations such as cost. Generally, however, a thickness of about 40 $\mu$m, preferably about 25 $\mu$m, and more preferably about 20 $\mu$m should not be exceeded. The bright nickel layer 16 generally has a thickness of at least about 1.2 $\mu$m, preferably at least about 3 $\mu$m, and more preferably at least about 6 $\mu$m. The upper thickness range of the bright nickel layer is not critical and is generally controlled by considerations such as cost. Generally, however, a thickness of about 60 $\mu$m, preferably about 50 $\mu$m, and more preferably about 40 $\mu$m should not be exceeded. The bright nickel layer 16 also functions as a leveling layer which tends to cover or fill in imperfections in the substrate.

In one embodiment, as illustrated in FIG. 2, disposed between the nickel layer 13 and the vapor deposited strike layer 32 are one or more additional metal or metal alloy layers 22 which function, inter alia, as a strengthening layer. This additional metal layer 22 may be deposited by electroplating or vapor deposition such as physical vapor deposition. This additional metallic layer includes but is not limited to chromium. When layer 22 is comprised of chromium it may be deposited on the nickel layer 13 by conventional and well known chromium electroplating techniques or conventional and well known physical vapor deposition techniques. The electroplating techniques along with various chrome plating baths are disclosed in Brassard, "Decorative Electroplating—A Process in Transition", Metal Finishing, pp. 105–108, June 1988; Zaki, "Chromium Plating", PF Directory, pp. 146–160; and in U.S. Pat. Nos. 4,460,438; 4,234,396; and 4,093,522, all of which are incorporated herein by reference.

Chrome plating baths are well known and commercially available. A typical chrome plating bath contains chromic acid or salts thereof, and catalyst ion such as sulfate or fluoride. The catalyst ions can be provided by sulfuric acid or its salts and fluosilicic acid. The baths may be operated at a temperature of about 112°–116° F. Typically in chrome plating a current density of about 150 amps per square foot, at about 5 to 9 volts is utilized.

The chrome layer generally has a thickness at least sufficient to function as a strengthening layer. Generally this thickness is at least about 0.05 $\mu$m, preferably at least about 0.12 $\mu$m, and more preferably at least about 0.2 $\mu$m. Generally, the upper range of thickness is not critical and is determined by secondary considerations such as cost. However, the thickness of the chrome layer should generally not exceed about 1.5 $\mu$m, preferably about 1.2 $\mu$m, and more preferably about 1 $\mu$m.

Instead of layer 22 being comprised of chromium it may be comprised of tin-nickel alloy, palladium-nickel alloy or nickel-tungsten-boron alloy.

The tin-nickel alloy layer may be deposited on the surface of the substrate by conventional and well known tin-nickel electroplating processes. These processes and plating baths are conventional and well known and are disclosed, inter alia, in U.S. Pat. Nos. 4,033,835; 4,049,508; 3,887,444; 3,772,168 and 3,940,319, all of which are incorporated herein by reference.

The tin-nickel alloy layer is preferably comprised of about 60–70 weight percent tin and about 30–40 weight percent nickel, more preferably about 65% tin and 35% nickel representing the atomic composition SnNi. The plating bath contains sufficient amounts of nickel and tin to provide a tin-nickel alloy of the afore-described composition.

A commercially available tin-nickel plating process is the NiColloy™ process available from ATOTECH, and described in their Technical Information Sheet No: NiColloy, Oct. 30, 1994, incorporated herein by reference.

The thickness of the tin-nickel alloy layer 22 is generally at least about 0.25 µm, preferably at least about 0.5 µm, and more preferably at least about 1 µm. The upper thickness range is not critical and is generally dependent on economic considerations. Generally, a thickness of about 50 µm, preferably about 25 µm, and more preferably about 15 µm should not be exceeded.

The nickel-tungsten-boron alloy layer may be deposited by plating such as electroplating or vapor deposition such as physical vapor deposition. If the nickel-tungsten-boron alloy layer is deposited by electroplating, it is deposited by conventional and well known nickel-tungsten-boron electroplating processes. The plating bath is normally operated at a temperature of about 115° to 125° F. and a preferred pH range of about 8.2 to about 8.6. The well known soluble, preferably water soluble, salts of nickel, tungsten and boron are utilized in the plating bath or solution to provide concentrations of nickel, tungsten and boron.

The amorphous nickel-tungsten-boron alloy layer generally contains at least 50, preferably at least about 55, and more preferably at least 57.5 weight percent nickel, at least about 30, preferably at least about 35, and more preferably at least 37.5 weight percent tungsten, and at least about 0.05, preferably at least about 0.5, and more preferably at least about 0.75 weight percent boron. Generally the amount of nickel does not exceed about 70, preferably about 65, and, more preferably about 62.5 weight percent, the amount of tungsten does not exceed about 50, preferably about 45, and, more preferably about 42.5 weight percent, and the amount of boron does not exceed about 2.5, preferably about 2, and more preferably about 1.25 weight percent. The plating bath contains sufficient amounts of the salts, preferably soluble salts, of nickel tungsten and boron to provide a nickel-tungsten-boron alloy of the afore-described composition.

A nickel-tungsten-boron plating bath effective to provide a nickel-tungsten-boron alloy of which a composition is commercially available, such as the Amplate™ system from Amorphous Technologies International of Laguna Niguel, Calif. A typical nickel-tungsten-boron alloy contains about 59.5 weight percent nickel, about 39.5 weight percent tungsten, and about 1% boron. The nickel-tungsten-boron alloy is an amorphous/nano-crystalline composite alloy. Such an alloy layer is deposited by the AMPLATE plating process marketed by Amorphous Technologies International.

The palladium-nickel alloy layer may be deposited by plating such as electroplating or vapor deposition such as physical vapor deposition. If the palladium-nickel alloy layer is deposited by electroplating, it is deposited by conventional and well known palladium-nickel electroplating process. Generally, they include the use of palladium salts or complexes such as nickel amine sulfate, organic brighteners, and the like. Some illustrative examples of palladium/nickel electroplating processes and baths are described in U.S. Pat. Nos. 4,849,303; 4,463,660; 4,416,748; 4,428,820 and 4,699,697, all of which are incorporated by reference.

The weight ratio of palladium to nickel in the palladium/nickel alloy is dependent, inter alia, on the concentration of palladium (in the form of its salt) in the plating bath. The higher the palladium salt concentration or ratio relative to the nickel salt concentration in the bath the higher the palladium ratio in the palladium/nickel alloy.

The palladium/nickel alloy layer generally has a weight ratio of palladium to nickel of from about 50:50 to about 95:5, preferably from about 60:40 to about 90:10, and more preferably from about 70:30 to about 85:15.

Over the strengthening layer 22 is deposited, by vapor deposition such as physical vapor deposition or chemical vapor deposition, a protective and decorative color layer 34. Color layer 34 is comprised of layers 36 of a carbon-rich refractory metal carbonitride or refractory metal alloy carbonitride alternating with layers 38 of nitrogen-rich refractory metal carbonitride or refractory metal alloy carbonitride, such as, for example, zirconium carbonitride, titanium carbonitride, hafnium carbonitride and tantalum carbonitride, and the carbonitrides of refractory metal alloys such as a titanium-zirconium alloy. These carbonitride layers may contain a small percentage of oxygen in order to increase the dark appearance of the coating. This small amount of oxygen ranges from about 2 to about 15 atomic percent. For zirconium, in the carbon-rich zirconium carbonitride layer, the carbon content generally is between about 25 to about 50 atomic percent, nitrogen content between about 5 to about 35 atomic percent, giving this layer a dark gray color. In the nitrogen-rich zirconium carbonitride layer, the nitrogen content is between about 25 to about 50 atomic percent, carbon content between about 5 to about 35 atomic percent, giving this layer a dark yellow color with a slightly reddish tint.

It is to be understood that in the practice of the instant invention each of layers 36 and 38 is too thin, or not thick enough, to provide or form the color of the individual layer. However, layers 36 and 38 are used in conjunction with each other and, when several layers are present, form a color and provide protective stack layer 34. As a result, the overall color of the stack layer 34 mimics or is a dark gray and dark yellow two-tone antique bronze color.

The number of layers 36 and 28 in stack layer 34 is generally from about 4 to about 50, preferably from about 8 to about 36. Each of layers 36 and 38 generally has a thickness of from about 30 Å to about 200 Å, preferably from about 50 Å to about 150 Å.

The thickness of this color and protective stack layer 34 is a thickness which is at least effective to provide the color of bronze, particularly antique bronze, and to provide abrasion resistance, scratch resistance, and wear resistance. Generally, this thickness is at least about 1,000 Å, preferably at least about 1,500 Å, and more preferably at least about 2,500 Å. The upper thickness range is generally not critical and is dependent upon secondary considerations such as cost. Generally a thickness of about 7500 Å, preferably about 5000 Å should not be exceeded.

Layer 34 is deposited by conventional and well known techniques including vapor deposition techniques such as cathodic arc evaporation (CAE) or sputtering, and the like. Sputtering and CAE techniques and equipment are disclosed, inter alia, in J. Vossen and W. Kern "Thin Film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

One method of depositing layer 34 is by physical vapor deposition utilizing reactive sputtering or reactive cathodic arc evaporation. Reactive cathodic arc evaporation and reactive sputtering are generally similar to ordinary sputtering and cathodic arc evaporation except that a reactive gas is introduced into the chamber which reacts with the dislodged target material. Thus, in the case where zirconium carbonitride is the layer 34, the cathode is comprised of zirconium and nitrogen and carbon-containing gas, such as methane or acetylene, are the reactive gases introduced into the chamber. When the carbon-rich zirconium carbonitride layer 36 is produced, the carbon gas flow is momentarily increased meanwhile nitrogen gas momentarily decreased. When the nitrogen-rich zirconium carbonitride layer 38 is produced, nitrogen gas flow is momentarily increased meanwhile carbon gas is momentarily decreased.

In addition to the protective color stack layer 34 there may optionally be present additional vapor deposited layers. These additional vapor deposited layers may include a layer 32 comprised of refractory metal or refractory metal alloy. The refractory metals include hafnium, tantalum, zirconium and titanium. The refractory metal alloys include zirconium-titanium alloy, zirconium-hafnium alloy and titanium-hafnium alloy. The refractory metal layer or refractory metal alloy layer 32 generally functions, inter alia, as a strike layer which improves the adhesion of the color layer 34 to the top electroplated layer. As illustrated in FIG. 1, the refractory metal or refractory metal alloy strike layer 32 is generally disposed intermediate the color layer 34 and the top electroplated layer. As illustrated in FIG. 2, the strike layer is disposed in the strengthening layer 22. Layer 32 has a thickness which is generally at least effective for layer 32 to function as a strike layer. Generally, this thickness is at least about 60 Å, preferably at least about 120 Å, and more preferably at least about 250 Å. The upper thickness range is not critical and is generally dependent upon considerations such as cost. Generally, however, layer 32 should not be thicker than about 1.2 μm, preferably about 0.5 μm, and more preferably about 0.25 μm.

The refractory metal or refractory metal alloy strike layer 32 is deposited by conventional and well known vapor deposition techniques including physical vapor deposition techniques such as cathodic arc evaporation (CAE) or sputtering. Briefly, in the sputtering deposition process a refractory metal (such as titanium or zirconium) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

In cathodic arc evaporation, an electric arc of typically several hundred amperes is struck on the surface of a metal cathode such as zirconium or titanium. The arc vaporizes the cathode material, which then condenses on the substrates forming a coating.

In a preferred embodiment of the present invention the refractory metal is comprised of titanium or zirconium, preferably zirconium, and the refractory metal alloy is comprised of zirconium-titanium alloy.

The additional vapor deposited layers may also include refractory metal compounds and refractory metal alloy compounds other ,than the above described carbonitrides. These refractory metal compounds and refractory metal alloy compounds include the refractory metal oxides and refractory metal alloy oxides; the refractory metal nitrides and refractory metal alloy nitrides; reaction products of (a) refractory metal or refractory metal alloy, (b) oxygen, and (c) nitrogen; and the refractory metal oxynitrides and refractory metal alloy oxynitrides.

In one embodiment of the invention as illustrated in FIGS. 1 and 2 a layer 40 comprised of the reaction products of a refractory metal or metal alloy, an oxygen containing gas such as oxygen, and nitrogen is deposited onto layer 34. The metals that may be employed in the practice of this invention are those which are capable of forming both a metal oxide and a metal nitride under suitable conditions, for example, using a reactive gas comprised of oxygen and nitrogen. The metals may be, for example, tantalum, hafnium, zirconium, zirconium-titanium alloy, and titanium, preferably titanium, zirconium-titanium alloy and zirconium, and more preferably zirconium.

The reaction products of the metal or metal alloy, oxygen and nitrogen are generally comprised of the metal or metal alloy oxide, metal or metal alloy nitride and metal or metal alloy oxy-nitride.

Thus, for example, the reaction products of zirconium, oxygen and nitrogen comprise zirconium oxide, zirconium nitride and zirconium oxy-nitride. These metal oxides and metal nitrides including zirconium oxide and zirconium nitride alloys and their preparation and deposition are conventional and well known, and are disclosed, inter alia, in U.S. Pat. No. 5,367,285, the disclosure of which is incorporated herein by reference.

The layer 40 can be deposited by well known and conventional vapor deposition techniques, including reactive sputtering and cathodic arc evaporation.

In another embodiment instead of layer 40 being comprised of the reaction products of a refractory metal or refractory metal alloy, oxygen and nitrogen, it is comprised of refractory metal oxide or refractory metal alloy oxide. The refractory metal oxides and refractory metal alloy oxides of which layer 40 is comprised include, but are not limited to, hafnium oxide, tantalum oxide, zirconium oxide, titanium oxide, and zirconium-titanium alloy oxide, preferably titanium oxide, zirconium oxide, and zirconium-titanium alloy oxide, and more preferably zirconium oxide. These oxides and their preparation are conventional and well known.

Layer 40 is effective in providing improved chemical, such as acid or base, resistance to the coating. Layer 40 containing (i) the reaction products of refractory metal or refractory metal alloy, oxygen and nitrogen, or (ii) refractory metal oxide or refractory metal alloy oxide generally has a thickness at least effective to provide improved chemical resistance but is not so thick as to obscure the color of color stack layer 34. Generally this thickness is at least about 10 Å, preferably at least about 25 Å, and more preferably at least about 40 Å. Layer 34 should be thin enough so that it does not obscure the color of underlying color layer 34. That is to say layer 40 should be thin enough so that it is non-opaque or substantially transparent. Generally layer 40 should not be thicker than about 0.10 μm, preferably about 250 Å, and more preferably about 100 Å.

In order that the invention may be more readily understood, the following example is provided. The example is illustrative and does not limit the invention thereto.

EXAMPLE

Brass faucets are placed in a conventional soak cleaner bath containing the standard and well known soaps, detergents, deflocculants and the like which is maintained at a pH of. 8.9–9.2 and a temperature of 180–200° F. for about 10 minutes. The brass faucets are then placed in a conventional ultrasonic alkaline cleaner bath. The ultrasonic cleaner bath has a pH of 8.9–9.2, is maintained at a temperature of about 160–180° F., and contains the conventional and well known soaps, detergents, deflocculants and the like. After the ultrasonic cleaning the faucets are rinsed and placed in a conventional alkaline electro cleaner bath. The electro cleaner bath is maintained at a temperature of about 140–180° F., a pH of about 10.5–11.5, and contains standard and conventional detergents. The faucets are then rinsed twice and placed in a conventional acid activator bath. The acid activator bath has a pH of about 2.0–3.0, is at an ambient temperature, and contains a sodium fluoride based acid salt. The faucets are then rinsed twice and placed in a bright nickel plating bath for about 12 minutes. The bright nickel bath is generally a conventional bath which is maintained at a temperature of about 130–150° F., a pH of about 4.0, contains $NiSO_4$, $NiCl_2$, boric acid, and brighteners. A bright nickel layer of an average thickness of about 10 $\mu$m is deposited on the faucet surface. The bright nickel plated faucets are rinsed three times and then placed in a conventional, commercially available hexavalent chromium plating bath using conventional chromium plating equipment for about seven minutes. The hexavalent chromium bath is a conventional and well known bath which contains about 32 ounces/gallon of chromic acid. The bath also contains the conventional and well known chromium plating additives. The bath is maintained at a temperature of about 112–146° F., and utilizes a mixed sulfate/fluoride catalyst. The chromic acid to sulfate ratio is about 200:1. A chromium layer of about 0.25 $\mu$m is deposited on the surface of the bright nickel layer. The faucets are thoroughly rinsed in deionized water and then dried.

The chromium plated faucets are placed in a cathodic arc evaporation plating vessel. The vessel is generally a cylindrical enclosure containing a vacuum chamber which is adapted to be evacuated by means of pumps. A source of argon gas is connected to the chamber by an adjustable valve for varying the rate of flow of argon into the chamber. In addition, sources of nitrogen, methane and oxygen gases are connected to the chamber by adjustable valves for varying the flow rates of nitrogen, methane and oxygen into the chamber.

A cylindrical cathode is mounted in the center of the chamber and connected to negative outputs of a variable D.C. power supply. The positive side of the power supply is connected to the chamber wall. The cathode material comprises zirconium.

The plated faucets are mounted on spindles, 16 of which are mounted on a ring around the outside of the cathode. The entire ring rotates around the cathode while each spindle also rotates around its own axis, resulting in a so-called planetary motion which provides uniform exposure to the cathode for the multiple faucets mounted around each spindle. The ring typically rotates at several rpm, while each spindle makes several revolutions per ring revolution. The spindles are electrically isolated from the chamber and provided with rotatable contacts so that a bias voltage may be applied to the substrates during coating.

The vacuum chamber is evacuated to a pressure of about $10^{-5}$ to $10^{-7}$ torr and heated to about 150° C.

The electroplated faucets are then subjected to a high-bias arc plasma cleaning in which a (negative) bias voltage of about –600 volts is applied to the electroplated faucets while an arc of approximately 500 amperes is struck and sustained on the cathode. The duration of the cleaning is approximately five minutes.

Argon gas is introduced at a rate sufficient to maintain a pressure of about 1 to 5 millitorr. A layer of zirconium having an average thickness of about 0.1 $\mu$m is deposited on the chrome plated faucets during a three minute period. The cathodic arc deposition process comprises applying D.C. power to the cathode to achieve a current flow of about 500 amps, introducing argon gas into the vessel to maintain the pressure in the vessel at about 1 to 5 millitorr and rotating the faucets in a planetary fashion described above.

After the zirconium layer is deposited a zirconium carbonitride color layer is deposited on the zirconium layer. Flows of nitrogen and methane are introduced into the vacuum chamber while the arc discharge continues at approximately 500 amperes. In order to increase the darkness of the coating, a small flow of oxygen, amounted to 5 to 10 percent of the total gas flow, may also be introduced into the chamber. To produce the dark gray color carbon-rich zirconium carbonitride, the flow rate of methane is momentarily increased meanwhile the flow rate of nitrogen is decreased, and thus the resulting layer contains a carbon content between 25 to 50 atomic percent and nitrogen content between 5 to 35 atomic percent. To produce the dark yellow nitrogen-rich carbonitride, the flow rate of nitrogen is momentarily increased meanwhile the flow rate of methane is decreased, and the resulting layer contains the nitrogen content between 25 to 50 atomic percent and carbon content between 5 to 35 atomic percent. Neither these two layers is thick enough to make the coating bear its own color. As a result, the overall color of the stack layers mimics a dark gray and dark yellow two-tone antique bronze appearance. After this zirconium carbonitride layer is deposited, the nitrogen flow is terminated and a flow of oxygen of approximately 20 to 80 standard liters per minute is introduced for a time of about 10 to 60 seconds. A thin layer of zirconium oxide with a thickness of about 20 to 100 Å is formed. The arc is extinguished, the vacuum chamber is vented and the coated articles removed.

While certain embodiments of the invention have been described for purposes of illustration, it is to be understood that there may be various embodiments and modifications within the general scope of the invention.

What is claimed is:

1. An article having on at least a portion of its surface a multi-layer coating having a bronze color comprising:
    basecoat layer comprised of nickel;
    color and protective stack layer comprised of layers of carbon-rich refractory metal carbonitride or carbon-rich refractory metal alloy carbonitride alternating with layers of nitrogen-rich refractory metal carbonitride or nitrogen-rich refractory metal alloy carbonitride.
2. The article of claim 1 wherein a strike layer comprised of refractory metal or refractory metal alloy is intermediate said basecoat layer and said color stack layer.
3. The article of claim 2 wherein a strengthening layer is over said nickel basecoat layer.
4. The article of claim 3 wherein said strengthening layer is comprised of chromium.
5. The article of claim 2 wherein a strengthening layer is intermediate said nickel basecoat layer and said strike layer.
6. The article of claim 5 wherein said strengthening layer is comprised of chromium.
7. The article of claim 5 wherein an oxide layer comprised of refractory metal oxide or refractory metal alloy oxide is on said color stack layer.
8. The article of claim 5 wherein an oxy-nitride layer comprised of reaction products of refractory metal or refractory metal alloy, oxygen and nitrogen is on said color stack layer.
9. The article of claim 2 wherein an oxide layer comprised of refractory metal oxide or refractory metal alloy oxide is on said color stack layer.
10. The article of claim 2 wherein an oxy-nitride layer comprised of reaction products of refractory metal or refractory metal alloy, oxygen and nitrogen is on said color stack layer.
11. The article of claim 1 wherein an oxy-nitride layer comprised of reaction products of refractory metal or refractory metal alloy, oxygen and nitrogen is on said color stack layer.

12. The article of claim 1 wherein said basecoat layer is comprised of two nickel layers.

13. The article of claim 12 wherein said two nickel layers comprise a semi-bright nickel layer on said substrate and a bright nickel layer on said semi-bright nickel layer.

14. The article of claim 1 wherein said layer of carbon-rich refractory metal alloy carbonitride contains a small amount of oxygen.

15. The article of claim 1 wherein said layer of nitrogen-rich refractory metal carbonitride or nitrogen-rich refractory metal alloy carbonitride contains a small amount of oxygen.

16. An article having on at least a portion of its surface a multi-layer coating having a bronze color comprising:

semi-bright nickel basecoat layer;

bright nickel basecoat layer;

strengthening layer;

strike layer comprised of refractory metal or refractory metal alloy;

color and protective stack layer comprised of layers of carbon-rich refractory metal carbonitride or carbon-rich refractory metal alloy carbonitride alternating with layers of nitrogen-rich refractory metal carbonitride or nitrogen-rich refractory metal alloy carbonitride.

17. The article of claim 16 wherein said strengthening layer is comprised of chromium.

18. The article of claim 16 wherein an oxide layer comprised of refractory metal oxide or refractory metal alloy oxide is on said color stack layer.

19. The article of claim 16 wherein an oxy-nitride layer comprised of reaction products of refractory metal or refractory metal alloy, oxygen and nitrogen is on said color stack layer.

20. The article of claim 16 wherein said nitrogen-rich refractory metal carbonitride or nitrogen-rich refractory metal alloy carbonitride contains at small amount of oxygen.

21. The article of claim 16 wherein said carbon-rich refractory metal carbonitride or carbon-rich refractory metal alloy carbonitride contains a small amount of nitrogen.

* * * * *